(12) United States Patent
Andreev et al.

(10) Patent No.: US 7,667,494 B2
(45) Date of Patent: Feb. 23, 2010

(54) METHODS AND APPARATUS FOR FAST UNBALANCED PIPELINE ARCHITECTURE

(75) Inventors: Alexander Andreev, San Jose, CA (US); Ivan Pavisic, San Jose, CA (US); Igor Vikhliantsev, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 25 days.

(21) Appl. No.: 12/058,881

(22) Filed: Mar. 31, 2008

(65) Prior Publication Data
US 2009/0243657 A1 Oct. 1, 2009

(51) Int. Cl.
*G11C 19/00* (2006.01)
*H03K 19/173* (2006.01)
(52) U.S. Cl. .............................. 326/93; 326/46; 377/64; 377/69
(58) Field of Classification Search .................. 326/93, 326/40, 46; 377/64, 75, 76, 69
See application file for complete search history.

(56) References Cited

U.S. PATENT DOCUMENTS
4,630,295 A * 12/1986 Kamuro et al. ............... 377/81

FOREIGN PATENT DOCUMENTS
JP 08265168 A * 10/1996

* cited by examiner

*Primary Examiner*—Daniel D Chang
(74) *Attorney, Agent, or Firm*—Ryan, Mason & Lewis, LLP

(57) ABSTRACT

Methods and apparatus are provided for a fast unbalanced pipeline architecture. A disclosed pipeline buffer comprises a plurality of memory registers connected in series, each of the plurality of memory registers, such as flip-flops, having an enable input and a clock input; and a controlling memory register having an output that drives the enable inputs of the plurality of memory registers, whereby a predefined binary value on an input of the controlling memory register shifts values of the plurality of memory registers on a next clock cycle. A plurality of the disclosed pipeline buffets can be configured in a multiple stage configuration. At least one of the plurality of memory registers can comprise a locking memory register that synchronizes the pipeline buffer. The pipeline buffer can optionally include a delay gate to delay a clock signal and an inverter to invert the delayed clock signal. The clock signal can be delayed by the delay gate such that an output of the pipeline buffer is applied to a next stage of a pipeline buffer at a correct time.

20 Claims, 4 Drawing Sheets

FIG. 5

| SHIFT | EN1 | Q1 | Q2 | Q3 | LOCK 1 | EN2 | Q4 | Q5 | Q6 | LOCK 2 |
|---|---|---|---|---|---|---|---|---|---|---|
| 0 | 0 | A1 | A2 | A3 | A3 | 0 | A4 | A5 | A6 | A6 |
| 1 | 0 | A1 | A2 | A3 | A3 | 0 | A4 | A5 | A6 | A6 |
| 1 | 1 | D0 | A1 | A2 | A3 | 0 | A4 | A5 | A6 | A6 |
| 1 | 1 | D1 | D0 | A1 | A2 | 1 | A3 | A4 | A5 | A5 |
| 0 | 1 | D2 | D1 | D0 | A1 | 1 | A2 | A3 | A4 | A4 |
| 0 | 0 | D2 | D1 | D0 | D0 | 1 | A1 | A2 | A3 | A3 |
| 0 | 0 | D2 | D1 | D0 | D0 | 0 | A1 | A2 | A3 | A3 |
| 1 | 0 | D2 | D2 | D1 | D0 | 0 | A1 | A2 | A3 | A3 |
| 0 | 1 | D3 | D2 | D1 | D1 | 1 | D0 | A1 | A2 | A3 |
| 0 | 0 | D3 | D2 | D1 | D1 | 0 | D0 | A1 | A2 | A2 |

METHODS AND APPARATUS FOR FAST UNBALANCED PIPELINE ARCHITECTURE

FIELD OF THE INVENTION

The present invention relates generally to pipeline registers, and more particularly, to pipeline architectures that can operate at higher frequencies.

BACKGROUND OF THE INVENTION

In many applications, data must be buffered in a pipeline register. For example, when the data to be processed in a single clock cycle exceeds the available processing capacity, the data can be stored in a pipeline register between clock cycles. FIG. 1 is a schematic block diagram illustrating a conventional pipeline architecture 100. As shown in FIG. 1, a pipelined register 100 typically comprises a plurality of hardware stages 110-1 through 110-N (N is equal to 4 in the exemplary embodiment). The hardware stages 110 are each embodied as memory registers, such as flip flops in the exemplary embodiment, connected in series.

The flip flops 110 store a sequence of data bits that ate passed from one flip flop 110-$i$ to the next flip flop 110-$i$+1 in the series on each clock cycle (CLK). The same clock signal, CLK, is applied to the clock input of each flip flop 110 in the pipeline buffer 100 by means of a known clock tree 120. The enable input of each flip flop 110 is connected to the same enable port, EN, of the pipeline buffer 100. The data bits are sequentially transferred from one flip flop 110-$i$ to a subsequent flip flop 110-$i$+1 in the pipeline 100 and each flip flop 110 is loaded with the next data bit in line. Since the flip flops 10 operate substantially concurrently, a pipelined system can operate faster than a non-pipelined system.

It has been found that the hold time constraints of a pipeline buffer 100 can be difficult to manage at high frequencies. In particular, the hold time constraint requires that the clock signal must arrive to the flip flop faster than the data arrives through the previous flip flop in the chain. The hold time constraint may not be guaranteed due to clock uncertainty for the longest clock tree paths. A need therefore exists for a pipeline architecture that can satisfy the flip flop hold time constraints for higher frequencies.

SUMMARY OF THE INVENTION

Generally, methods and apparatus are provided for a fast unbalanced pipeline architecture. According to one aspect of the invention, a pipeline buffer is disclosed that comprises a plurality of memory registers connected in series, each of the plurality of memory registers having an enable input and a clock input; and a controlling memory register having an output that drives the enable inputs of the plurality of memory registers, whereby a predefined binary value on an input of the controlling memory register shifts values of the plurality of memory registers on a next clock cycle. The plurality of memory registers can be embodied, for example, as flip-flops. A plurality of the disclosed pipeline buffers can be configured in a multiple stage configuration.

According to a further aspect of the invention, at least one of the plurality of memory registers can comprise a locking memory register that synchronizes the pipeline buffer. The locking memory register can lock an output of the controlling memory register for a clock cycle.

The pipeline buffer can optionally include a delay gate to delay a clock signal that is applied to the clock inputs. The clock signal can be delayed by the delay gate such that an output of the pipeline buffer is applied to a next stage of a pipeline buffer at a collect time. In addition, the pipeline buffer can optionally include an inverter to invert the delayed clock signal.

A more complete understanding of the present invention, as well as further features and advantages of the present invention, will be obtained by reference to the following detailed description and drawings.

BRIEF DESCRIPTION OF THE DRAWINGS

FIG. 5 is a sample table illustrating the transfer of data through the pipeline.

DETAILED DESCRIPTION

The present invention provides methods and apparatus for a fast unbalanced pipeline architecture. As previously indicated and discussed further below, the hold time constraints of a pipeline buffer 100 can be difficult to manage at high frequencies. The present invention provides a pipeline architecture that can satisfy the flip flop hold time constraints for higher frequencies.

Timing Constraints

Figure 1:
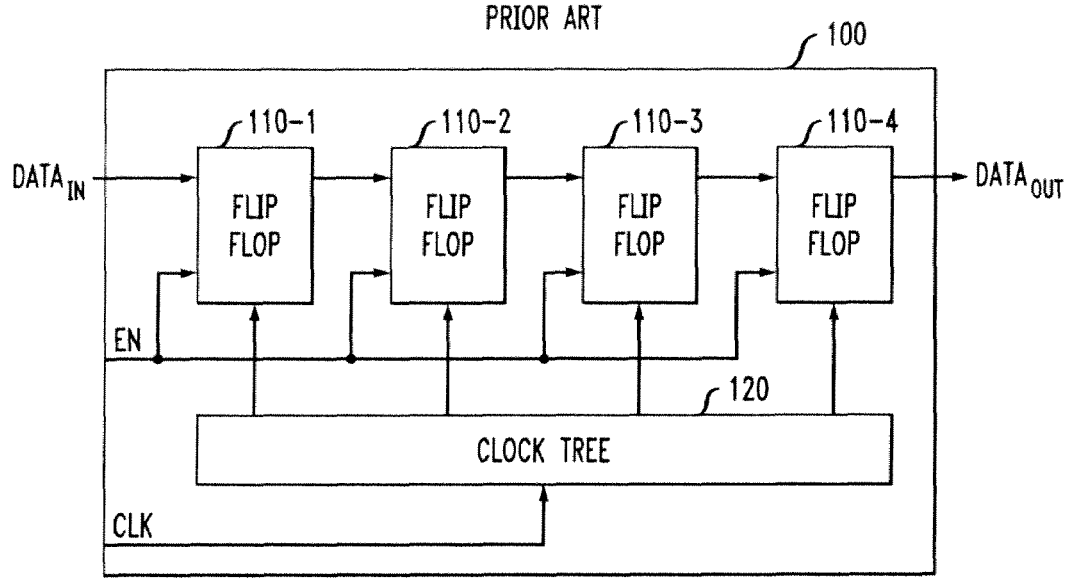
FIG. 1 is a schematic block diagram illustrating a conventional pipeline architecture.
Figure 2:
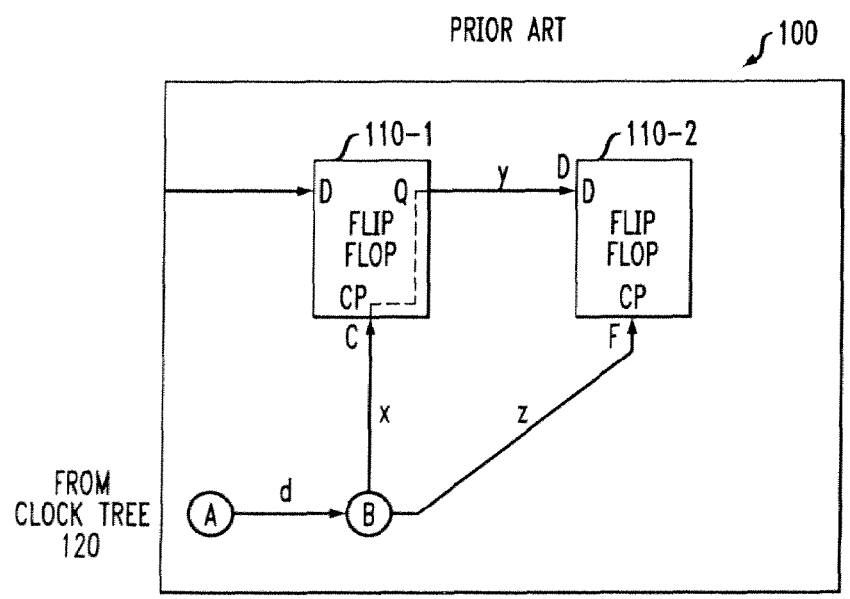
FIG. 2 illustrates a portion of the conventional pipeline architecture of FIG. 1 in further detail.

FIG. 2 illustrates a portion of the conventional pipeline architecture 100 of FIG. 1 in farther detail. As shown in FIG. 2, the pipeline architecture 100 includes a CLOCK pin position, A, and clock positions C and F for flip-flops 110-1 and 110-2, respectively. Flip-flop 110-2 has port position D. The point B is the point where the path AB has a maximal common interval of paths to clock ports C and F. The delay on interval BC is denoted by x, the delay on interval CD is denoted by y, the delay on interval BF is denoted by z and the delay on interval AB is denoted by d. For d, x, y and z, there is a next limitation for the timing on the second flip-flop 110-2 when both flip-flops 110-1 and 1102 are driven by the same clock, as follows:

For hold time (clock must arrive on the second flip-flop 110-2 faster then the data arrives on port position D through the first flip-flop 110-1):

$$d+x+y \geq d+(1+\text{clock\_uncertainty}) \cdot z - \text{flip\_flop\_hold-time} \quad (1)$$

where clock_uncertainty is the clock uncertainty based on the process technology (for example, it is 0.15 for 120 nm and 0.12 for 90 nm).

For setup time (data arrival on port position D cannot be more tan delay d+z on CLOCK plus the clock period, otherwise the data signal is missed on the second flip-flop 110-2):

$$d+x+y \leq d+(1-\text{clock\_uncertainty}) \cdot z + \text{clock\_period}$$

Since the distance between the flip-flops 110-1 and 110-2 is large enough, the distance must be compensated for by adding some delay del on CLOCK for z. This operation will improve the setup time but will also increase the hold time:

$$d+x+y \geq d+(1+\text{clock\_uncertainty}) \cdot (z+del) - \text{flip\_flop\_holdtime}$$

$$d|x|y \leq d|(1-\text{clock\_uncertainty}) \cdot (z+del) + \text{clock\_period}$$

Generally, the most critical part is the hold limitation (equation (1)) and it can be more relaxed by putting (z+del) on the negative edge of CLOCK (e.g, by adding an inverter on z). In this case, the timing limitations can be expressed as follows:

$$x - y \geq (1+\text{clock\_uncertainty}) \cdot (z+del) - \text{flip\_flop\_hold-time} - 0.5 \cdot \text{clock\_period}$$

$$x + y \leq (1-\text{clock\_uncertainty}) \cdot (z+del) + 0.5 \cdot \text{clock\_period}$$

These limitations are more balanced and can be accounted for with the disclosed fast pipeline architecture.

Timing Limitations for Conventional Architecture

For the conventional pipeline architecture 100 of FIG. 1, for a balanced clock tree 120, there are two flip-flops where the point B is the same as the tree root A. In this case, the intervals AC (BC) and AF (BF) could be significantly long (e.g., a few millimeters even for medium size designs), so the influence of clock uncertainty (clock_uncertainty z) would also be very large. It has been found that for a balanced clock tree, x and z are almost the same (suppose x=z), so the hold time limitation of equation (1) can be rewritten as:

$$y \geq \text{clock\_uncertainty} \cdot z - \text{flip\_flop\_holdtime} \quad (2)$$

In equation (2), y must be small (in the case of high frequency) but the clock uncertainty can be significantly large because the second flip-flop 110-2 can be in an arbitrary place on the chip (a large value of z). Thus, high frequencies cannot be achieved with the conventional pipeline architecture 100 of FIG. 1

Unbalanced Architecture

Figure 3:
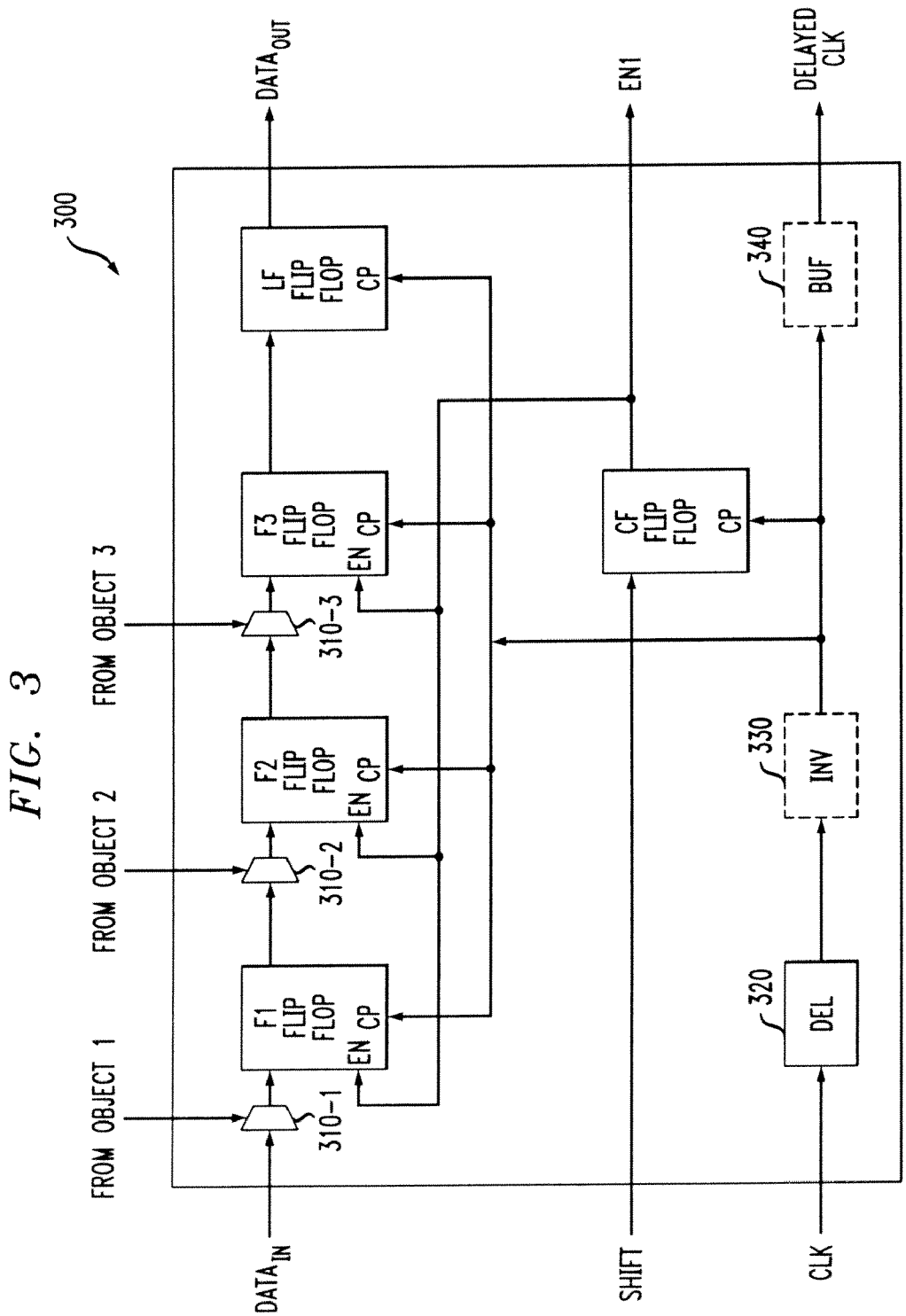
FIG. 3 is a schematic block diagram illustrating a pipeline architecture incorporating features of the present invention.

FIG. 3 is a schematic block diagram illustrating a pipeline architecture 300 incorporating features of the present invention. As shown in FIG. 3, the exemplary pipelined register 300 comprises a plurality of memory registers, such as flip flops F1 through F3, and LF (discussed further below), connected in series. As previously indicated, the flip flops 310 store a sequence of data bits that are passed from one flip flop 310-i to the next flip flop 310-i+1 in the series on each clock cycle According to one aspect of the invention, the clock signal, CLK, is first delayed by a delay gate 320 before being applied to the clock input of each flip flop 310 in the pipeline buffer 300. Generally, the delay introduced by the delay gate 320 is dependent on the clock period. The clock signal is delayed by the delay gate 320 such that the output data is applied to the next stage at the collect time. In addition, the delayed clock signal is optionally inverted by an inverter 330. The inverter 330 can eliminate the hold time and make the circuit mote stable (for both best case and worst case timing). Thus, since the same delayed clock is applied to each flip-flop in parallel, a clock tree, such as the clock tree 120, is not required in the pipeline buffer 300.

According to a further aspect of the invention, the pipeline buffer 300 includes a controlling flip-flop, CF. The output of the controlling flip-flop, CF, drives the enable inputs (EN) for all remaining flip-flops (F1-F3) in this group. Thus, each binary value of one (1) on the input of the controlling flip-flop, CF, shifts the values on the remaining flip-flops (F1-F3 and L3) on the next clock cycle. Thus, the controlling flip-flop, CF, delays the incoming signal for one clock cycle According to yet another aspect of the invention, the locking flip-flop LF synchronizes the pipeline 300. A binary value of one (1) that is an output of the controlling flip-flop CF for this group shown in FIG. 3 will be an output of the controlling flip-flop for the next group (not shown in FIG. 3, but discussed further below in conjunction with FIG. 4), only on the next clock cycle. Thus, the output of the controlling flip-flop, CF, must be delayed (locked) for one clock cycle.

For a multi-stage implementation, the pipeline buffet 300 optionally includes a buffer (BUF) 340. The buffer 340 eliminates a ramp-time violation on a long network. The interval between groups can be, for example, 0.5-1 mm, so the bounding box (and capacitance) needs to be reduced for the network that drives the flip-flop clocks.

As shown in FIG. 3, the exemplary pipeline buffer 300 optionally includes a multiplexer 310-1 through 310-3 associated with each data flip-flop F1-F3. The multiplexers 310 provide additional flexibility for a chip designed. F or example, the multiplexers 310 allow the pipeline buffer 300 to be used for memory tests. In the implementation shown in FIG. 3, the multiplexers 310 receive signals from corresponding objects. For example, the objects may be a memory collar that returns a binary value of one (1) if a memory test passed and a binary value of zero (0) if a test failed. In this manner, memory error's can be tracked. In a further variation, if all the multiplexers 310 are enabled, then the next data is obtained from each object for one clock cycle. Thereafter, there is a chain of values from the objects in the pipeline buffer 300. The data from the first object can then be used as input for the second object and so on.

Figure 4:
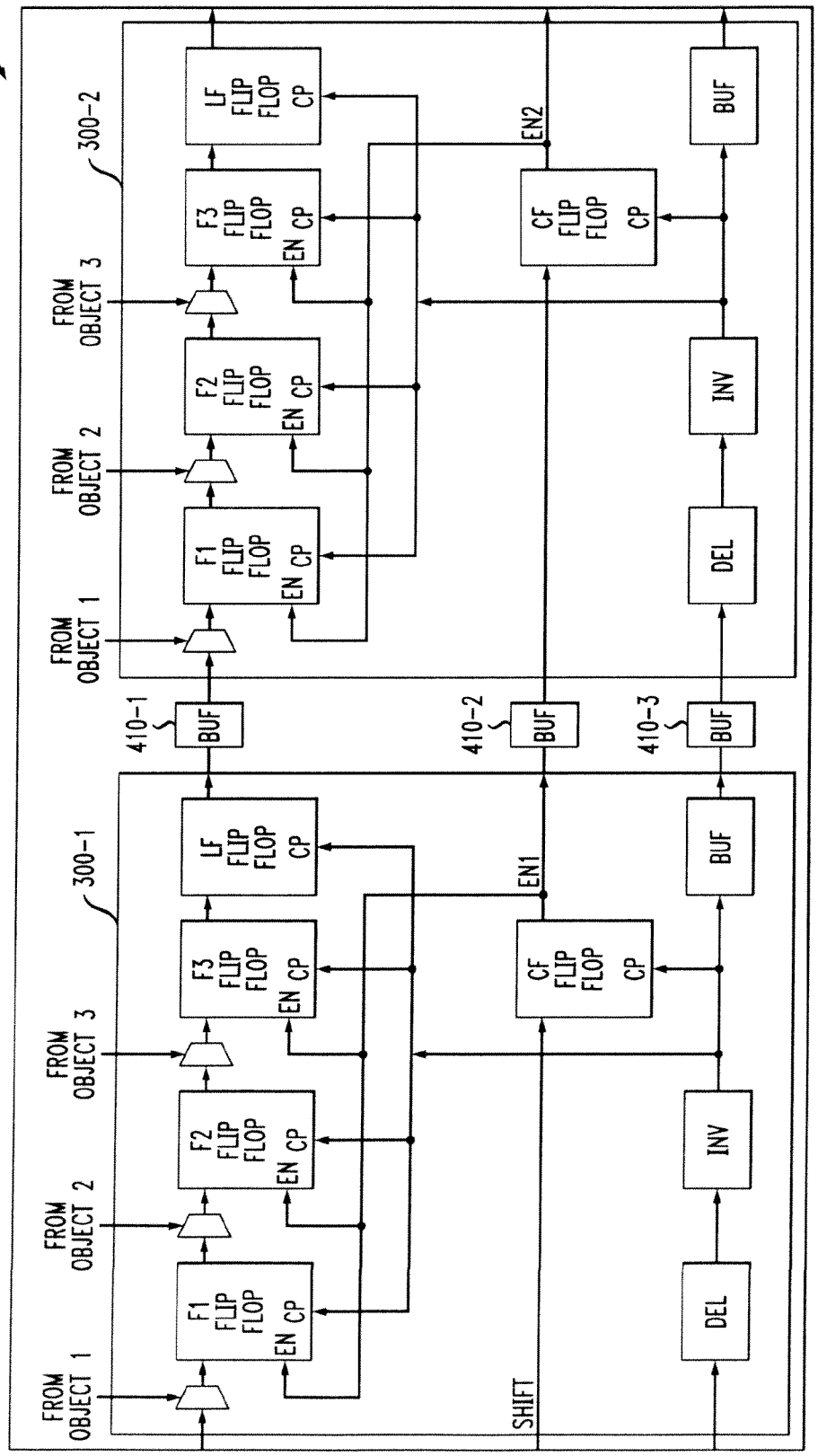
FIG. 4 illustrates a multi-stage implementation of the pipeline buffers of FIG. 3.

FIG. 4 illustrates a multi-stage implementation 400 of the pipeline buffers 300 of FIG. 3. As shown in FIG. 4, the exemplary implementation 400 includes two stages 300-1 and 300-2 that may each be implemented in the same manner as discussed above in conjunction with FIG. 3. In addition, between each state in the exemplary multi-stage pipeline 400, a strength buffer gate 410-1 through 410-3 is used in the middle of a clock interval to strengthen the signals. To reduce the influence of crosstalk (e.g., speed up or negative effect on neighboring nets) for long intervals, the strength buffer gate 410-1 through 410-3 can be shielded between intervals.

FIG. 5 is a sample table 500 illustrating the transfer of data through the pipeline 300, 400. Assume that each flip-flop group contains three data flip-flops F1-F3 and one locking flip-flop LF and one controlling flip-flop CF. Assume further that there are two pipeline groups with a total of six data flip-flops, such as the implementation of FIG. 4. As shown in FIG. 4, the input signal for the controlling flip-flop CF of first group is denoted by SHIFT, the output of the controlling flip-flop CF from the first group is denoted EN1, and the output of the controlling flip-flop CF for the second group is denoted as EN2. Each row in the table 500 corresponds to one clock cycle.

As seen from the table 500, for each binary value of one (1) on the SHIFT signal, the values on the data flip-flops F1-F3 in the pipeline 300 are shifted and when EN1 and/or EN2 equals a binary value of zero (0), the corresponding value of the last data flip-flop F3 is stored in the locking flip-flop LF.

CONCLUSION

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or mole aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

A plurality of identical die are typically formed in a repeated pattern on a surface of the wafer. Each die includes a device described herein, and may include other structures or circuits. The individual die ate cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A pipeline buffer, comprising:
   a plurality of memory registers connected in series, each of said plurality of memory registers having an enable input and a clock input; and
   a controlling memory register having an output that drives said enable inputs of said plurality of memory registers, whereby a predefined binary value on an input of said controlling memory register shifts values of one of said plurality of memory registers to another of said plurality of memory registers on a next clock cycle.

2. The pipeline buffer of claim 1, wherein said plurality of memory registers are flip-flops.

3. The pipeline buffer of claim 1, wherein at least one of said plurality of memory registers comprises a locking memory register that synchronizes said pipeline buffer.

4. The pipeline buffer of claim 3, wherein said locking memory register locks an output of said controlling memory register for a clock cycle.

5. The pipeline buffer of claim 1, further comprising a delay gate to delay a clock signal that is applied to said clock inputs.

6. The pipeline buffer of claim 5, wherein said clock signal is delayed by said delay gate such that an output of said pipeline buffer is applied to a next stage of a pipeline buffer at a correct time.

7. The pipeline buffer of claim 5, further comprising an inverter to invert said delayed clock signal.

8. The pipeline buffer of claim 1, further comprising a plurality of said pipeline buffers configured in a multiple stage configuration.

9. An integrated circuit, comprising:
   a pipeline buffer, comprising:
   a plurality of memory registers connected in series, each of said plurality of memory registers having an enable input and a clock input; and
   a controlling memory register having an output that drives said enable inputs of said plurality of memory registers, whereby a predefined binary value on an input of said controlling memory register shifts values of one of said plurality of memory registers to another of said plurality of memory registers on a next clock cycle.

10. The integrated circuit of claim 9, wherein said plurality of memory registers are flip-flops.

11. The integrated circuit of claim 9, wherein at least one of said plurality of memory registers comprises a locking memory register that synchronizes said pipeline buffer.

12. The integrated circuit of claim 11, wherein said locking memory register locks an output of said controlling memory register for a clock cycle.

13. The integrated circuit of claim 9, further comprising a delay gate to delay a clock signal that is applied to said clock inputs.

14. The integrated circuit of claim 13, wherein said clock signal is delayed by said delay gate such that an output of said pipeline buffer is applied to a next stage of a pipeline buffer at a correct time.

15. The integrated circuit of claim 13, further comprising an inverter to invert said delayed clock signal.

16. The integrated circuit of claim 9, further comprising a plurality of said pipeline buffers configured in a multiple stage configuration.

17. A method for fabricating a pipeline buffer, comprising:
   connecting a plurality of memory registers in series, each of said plurality of memory registers having an enable input and a clock input; and
   providing a controlling memory register having an output that drives said enable inputs of said plurality of memory registers, whereby a predefined binary value on an input of said controlling memory register shifts values of one of said plurality of memory registers to another of said plurality of memory registers on a next clock cycle.

18. The method of claim 17, wherein said plurality of memory registers are flip-flops.

19. The method of claim 17, wherein at least one of said plurality of memory registers comprises a locking memory register that synchronizes said pipeline buffer.

20. The method of claim 17, further comprising the step of configuring a plurality of said pipeline buffers in a multiple stage configuration.

* * * * *

UNITED STATES PATENT AND TRADEMARK OFFICE
CERTIFICATE OF CORRECTION

PATENT NO. : 7,667,494 B2  Page 1 of 1
APPLICATION NO. : 12/058881
DATED : February 23, 2010
INVENTOR(S) : Alexander Andreev It is certified that error appears in the above-identified patent and that said Letters Patent is hereby corrected as shown below:

In column 2, line 67, "d|x|y" should be replaced by -- d+x+y --.

In column 3, line 6, "x-y" should be replaced by -- x+y --.

Signed and Sealed this
Eighteenth Day of December, 2012

David J. Kappos
*Director of the United States Patent and Trademark Office*